US008098081B1

(12) United States Patent  
Trimberger

(10) Patent No.: US 8,098,081 B1  
(45) Date of Patent: Jan. 17, 2012

(54) OPTIMIZATION OF INTERCONNECTION NETWORKS

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/819,903

(22) Filed: Jun. 21, 2010

(51) Int. Cl.
*H01L 25/00* (2006.01)

(52) U.S. Cl. ............................. 326/41; 326/47; 326/101

(58) Field of Classification Search .............. 326/37–41, 326/47, 101
See application file for complete search history.

(56) References Cited

U.S. PATENT DOCUMENTS

| 6,018,523 | A | 1/2000 | Even |
| 6,370,140 | B1 | 4/2002 | Nayak |
| 6,693,456 | B2 | 2/2004 | Wong |
| 6,940,308 | B2 | 9/2005 | Wong |
| 6,982,974 | B1 * | 1/2006 | Saleh et al. ................. 370/386 |
| 7,028,281 | B1 | 4/2006 | Agrawal et al. |
| 7,242,216 | B1 | 7/2007 | Schmit et al. |
| 7,285,487 | B2 | 10/2007 | DeHon et al. |
| 2002/0113619 | A1 | 8/2002 | Wong |
| 2003/0043842 | A1 * | 3/2003 | Tran ........................... 370/458 |
| 2004/0150422 | A1 | 8/2004 | Wong |
| 2005/0218928 | A1 | 10/2005 | Pani et al. |
| 2006/0006906 | A1 | 1/2006 | Pani et al. |
| 2007/0268041 | A1 | 11/2007 | Pani et al. |
| 2008/0272806 | A1 | 11/2008 | Pani et al. |
| 2009/0273368 | A1 | 11/2009 | Pani et al. |
| 2010/0244895 | A1 | 9/2010 | Pani et al. |

FOREIGN PATENT DOCUMENTS

| WO | WO 2008/109756 A1 | 9/2008 |
| WO | WO 2008/147926 A1 | 12/2008 |
| WO | WO 2008/147927 A1 | 12/2008 |
| WO | WO 2008/147928 A1 | 12/2008 |

OTHER PUBLICATIONS

U.S. Appl. No. 12/819,900, filed Jun. 21, 2010, Trimberger.
U.S. Appl. No. 12/819,953, filed Jun. 21, 2010, Trimberger.
Bertacco, V. et al., *Decision Diagrams and Pass Transistor Logic Synthesis*, Technical Report No. CSL-TR-97-748, Dec. 1997, pp. 1-12, Stanford University, Computer Systems Laboratory, Stanford, California, USA.
Mehrotra, Rakesh et al., "Comparison between nMOS Pass Transistor Logic style vs. CMOS Complementary Cells," *Proc. of the 1997 IEEE Conference on Computer Design (ICCD '97)* Oct. 12, 1997, pp. 1-6, IEEE Computer Society, Los Alamitos, California, USA.
Newman, Peter, *Fast Packet Switching for Integrated Services*, Dec. 1988, Wolfson College, University of Cambridge Computer Laboratory, Cambridge, United Kingdom.
U.S. Appl. No. 13/152,131, filed Jun. 2, 2011, Trimberger.

* cited by examiner

*Primary Examiner* — Shawki S Ismail
*Assistant Examiner* — Thienvu Tran
(74) *Attorney, Agent, or Firm* — LeRoy D. Maunu

(57) ABSTRACT

A method is implemented for generating a non-blocking routing network design from a crossbar switch-based network design. The non-blocking routing network design includes connections to logic blocks of a programmable integrated circuit. A programmed processor is used to determine, for each row of the crossbar switch-based network design, switches in the row that provide switching functions for logically equivalent external connections, the external connections being one of external inputs and external outputs. The identified switches are removed from the crossbar switched-based network design. Information about the identified switches and the logically equivalent external connections is then stored for access by a placement module associated with the programmable integrated circuit.

20 Claims, 11 Drawing Sheets

US 8,098,081 B1

OPTIMIZATION OF INTERCONNECTION NETWORKS

FIELD OF THE INVENTION

The disclosed embodiments generally relate to interconnection networks, and more particularly, to optimizations of interconnection networks.

BACKGROUND

Programmable logic devices (PLDs) are a type of programmable integrated circuit (IC) that can be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes configurable logic blocks (CLBs), programmable input/output blocks (IOBs), and other types of logic blocks, such as memories, microprocessors, digital signal processors (DSPs), and the like. The CLBs, IOBs, and other logic blocks are interconnected by a programmable interconnect structure. The programmable interconnect structure (also referred to as a routing fabric) typically includes conductors of various lengths interconnected by programmable switches (referred to as programmable routing resources). For example, some types of conductors may span two CLBs (referred to as doubles), while other types of conductors may span six CLBs (referred to as hexes). The CLBs, IOBs, logic blocks, and interconnect structure are typically programmed by loading a stream of configuration data (known as a bitstream) into internal configuration memory cells that define how the CLBs, IOBs, logic blocks, and interconnect structure are configured. An FPGA may also include various dedicated logic circuits, such as digital clock managers (DCMs), input/output (I/O) transceivers, boundary scan logic, and the like.

For many FGPA designs it is desirable that the interconnection network allow for a robust set of routing solutions. For instance, the interconnection network can be strict-sense or rearrangeably non-blocking. The technology behind FPGAs, however, is ever-changing and the interconnection network designs have not kept pace. Moreover, many commonly-used interconnection network types have been studied for their efficacy relative to systems other than FPGAs. In general, these networks tend to be expensive in terms of size and delay for the restricted interconnection problem posed for FPGAs. Thus, many interconnection networks are not necessarily well-suited for use in FPGA designs.

The described embodiments may address one or more of the above issues.

SUMMARY

Consistent with one embodiment, a method of generating a non-blocking routing network design from a crossbar switch-based network design is provided. The non-blocking routing network design includes connections to logic blocks of a programmable integrated circuit. A programmed processor is used to determine, for each row of the crossbar switch-based network design, switches in the row that provide switching functions for logically equivalent external connections. The external connections are either external inputs or external outputs. The identified switches are removed from the crossbar switched-based network design. Information about the identified switches and the logically equivalent external connections is then stored for access by a placement module associated with the programmable integrated circuit.

According to one or more embodiments, outputs for each of the rows can be determined. The outputs may include internal outputs that are connected to other rows and external outputs that are connected to nodes external to the crossbar switched-based network. For each determined output, a corresponding set of inputs that can be routed thereto may be determined. For each determined output, a corresponding multiplexer can be provided for connecting the respective set of inputs to the determined output.

Consistent with another embodiment, the step of determining switches may include identifying switches that are coupled to a look-up-table (LUT).

Another embodiment relates to determining switches that are coupled to a look-up-table (LUT) and assigning outputs of the LUT as a function of a network routing solution.

According to another embodiment, the stored information about the identified switches and the logically equivalent external connections can be accessed and a logic design can be placed within a programmable integrated circuit using the information about the identified switches and a routing solution.

Consistent with another embodiment, the step of determining switches may include the identification of switches that are coupled to the input of a common multiplexer.

In yet another embodiment, the crossbar switch-based network design can be one of Clos, Benes, Banyan, Omega or Delta.

Adjusting a logic function relative to the logically equivalent external connections to compensate for the removed, identified switches is provided by another embodiment.

Other embodiments relate to implementations within a field programmable logic array.

In another embodiment, a non-blocking routing network includes a plurality of external inputs and a plurality of external outputs. A first plurality of routing rows each provide a routing path from at least one of the plurality of external inputs to at least one of the plurality of external outputs. Each row of the first plurality of routing rows includes first, second, third, and fourth multiplexers. The first multiplexer includes a first set of inputs and a first internal output. The first set of inputs can include two external inputs of the plurality of external inputs. The first multiplexer is configured to provide a selected input of the first set of inputs to the first output in response to a first selection input. The second multiplexer may include a second set of inputs and a second internal output. The second set of inputs can include the two external inputs of the plurality of external inputs and a second internal output from a first other routing circuit. The second multiplexer is configured to provide a first selected input of the second set of inputs to the second output in response to a second selection input. The third multiplexer can include a third set of inputs and a first external output. The third set of inputs may include the two external inputs of the plurality of external inputs and the second internal output from a first other routing circuit and a second internal output from a second other routing circuit. The second multiplexer is configured to provide a selected input of the third set of inputs to the first external output in response to a third selection input. The fourth multiplexer can include the third set of inputs and a second external output. The fourth multiplexer is configured to provide a second selected input of the third set of inputs to the first external output in response to a fourth selection input. Each row of a second plurality of routing rows provides a routing path from at least two of the plurality of external inputs to at least two of the plurality of external outputs. The second plurality of routing rows contain at least one less multiplexer relative to the routing circuits of the first set of routing circuits, the one less multiplexor corresponding to at least two external inputs or two external outputs that are logically equivalent to one another.

In another embodiment, the non-blocking routing network may include additional routing circuits, and the third set of inputs further includes a local output from each additional routing circuit.

One or more embodiments may be implemented for a non-blocking routing network that includes a plurality of rows. Each corresponds to a respective routing circuit, and the third set of inputs further include a local output from each routing circuit.

Consistent with one or more further embodiments, in combination with assignment of look-up-table (LUT) functionality for LUTs coupled to the plurality of external inputs and the plurality of external outputs, the non-blocking routing network may provide the functional routing equivalent to a Benes network.

Another embodiment relates to the two external inputs or two external outputs are connected to the same look-up-table.

One or more embodiments are directed to a multiplexer-based network for providing routing equivalent to a crossbar non-blocking network that has a plurality of crossbar switches. The crossbar switches make up an ingress stage, a middle stage and an egress stage. The crossbar non-blocking network includes a plurality of crossbar rows, and each crossbar row includes outbound and inbound internal connections to another crossbar row. The multiplexer-based network includes a first plurality of multiplexer-based network rows, at least one external multiplexer, and a second plurality of multiplexer-based network rows. Each multiplexer-based network row of the first plurality corresponds to a crossbar row of the crossbar non-blocking network and includes at least one external input, at least one external output, a plurality of internal inputs, a plurality of internal outputs, and a set of multiplexers. The set of multiplexers includes an internal multiplexer for each respective internal output of the respective crossbar row. The internal multiplexer may include a set of inputs coupled to signals routable to the respective outbound internal connection of the respective crossbar row. The at least one external multiplexer can provide a signal to an external output of the multiplexer-based network row. The external multiplexer may include a set of inputs that includes each input of the respective crossbar row, and a second plurality of multiplexer-based network rows that connect to at least two logically interchangeable external connections. The second subset of network rows couple to at least two logically interchangeable external connections and do not contain an internal multiplexer for at least one outbound internal connection of the respective crossbar row.

In another embodiment, the crossbar non-blocking network may be implemented as a Benes network.

A further embodiment is directed to the logically interchangeable external connections being coupled to a look-up-table.

It will be appreciated that various other embodiments are set forth in the Detailed Description and Claims which follow.

BRIEF DESCRIPTION OF THE DRAWINGS

Various aspects and advantages of the disclosed embodiments will become apparent upon review of the following detailed description and upon reference to the drawings, in which.

DETAILED DESCRIPTION

Figure 1:
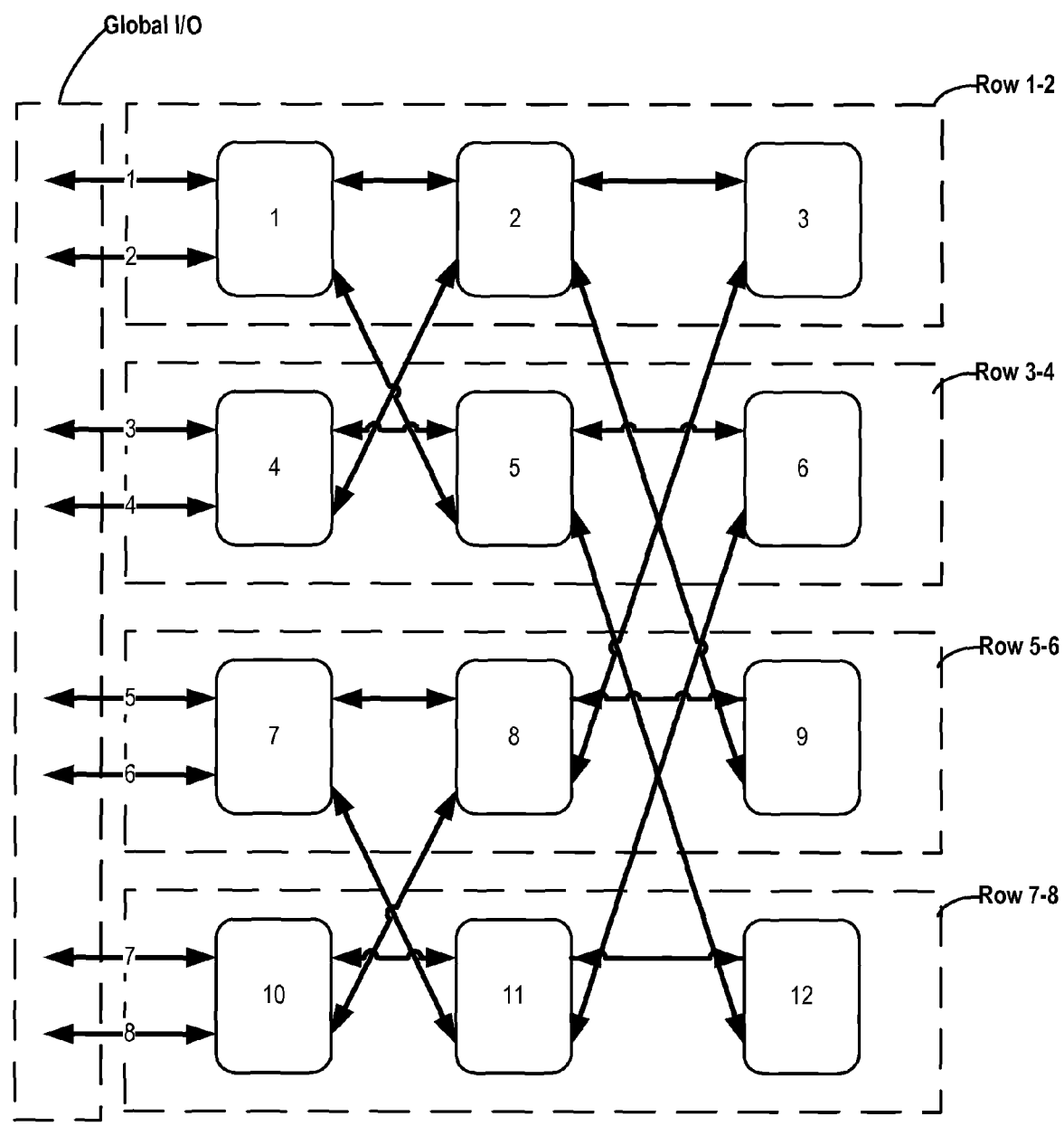
FIG. 1 depicts a logical diagram for an interconnection network.

The various disclosed embodiments provide an interconnection network within a programmable integrated circuit (IC). The interconnection network is optimized according to the properties of the programmable integrated circuit. The optimization can include removing switch components from the interconnection network without losing the routing properties (e.g., non-blocking) of the network. Particular aspects of the disclosed embodiments relate to optimizing such multiplexer-based interconnection networks by recognizing equivalent properties of pins within a programmable integrated circuit. FPGAs are used herein as exemplary ICs to which the embodiments can be applied. However, the embodiments are not so limited, and the teachings can be applied to other programmable ICs and other routing networks.

Many interconnection networks use multistage interconnection networks. Such multistage networks can include three stages of switches: ingress switches, middle switches, and egress switches. The ingress switches receive global/external signals as inputs and provide these global signals to the middle switches using internal connections. The middle switches receive and transmit signals on such internal connections. Egress switches receive signals from internal connections from the middle switches and transmit the signals to global outputs. A multi-stage network may be hierarchical in that one stage of switching is itself a multi-stage network.

As used herein and unless otherwise stated, a non-blocking network can be either a strict-sense or rearrangeably non-blocking network. Non-limiting examples of multistage interconnection network types include Clos, Benes, Banyan, Omega and Delta. A Clos network can be either a strict-sense or rearrangeably non-blocking network. A Benes network is a rearrangeably non-blocking network that can include many internal/middle stages. A Benes network may be extended to be non-blocking for multi-cast signals.

Examples discussed herein refer to embodiments that are discussed in relation to one or more particular network types; however, embodiments of the present disclosure are not so limited. For instance, the various embodiments that are premised upon aspects of particular networks, such as Benes networks, can be generalized to allow for various other types of networks to be used. Moreover, relatively minor variations can be made to the particular network types. This can include modifying a few inputs, outputs, switches or connections, whilst the majority of the network remains the same. In this manner, the resulting network might not be 100 percent non-blocking; however, such minor changes are often largely immaterial, e.g., when the network remains very close to being non-blocking despite the modifications.

Particular aspects of the disclosed embodiments are described in relation to network rows. The term network row generally refers to a set of switches that a signal traverses in order to be routed between an input and an output. Each network row contains a set of switches that are non-overlapping (no switch resides in two different rows) with respect to the switches of each of the other network rows. In a particular example, rows can be defined, within a logical diagram of a network design, by pairing inputs to outputs and then defining the rows according to routing paths that include the minimum number of switches between the paired inputs and outputs. As used herein an internal input or output refers to a connection between rows of a network, and a global/external input or output refers to a connection that leaves the network.

In many FPGA designs the routing fabric allows for bi-directional routing to and from each logic block. Although not necessarily limited thereto, one or more embodiments select the rows by following a path that a signal traverses in order to be routed to and from the same logic block. This can be particularly useful for physical and/or logical design or placement of row components according to the logic block input and output that defines the particular row. For instance, the components of a row can be located near the logic block corresponding to the input and output signals for the logic block, i.e., located physically proximate to a particular logic block relative to the other logic blocks of the FPGA.

Signals originating from components outside the interconnection network are referred to as global input signals. Signals that are provided to components outside of the interconnection network are referred to as global output signals. The ingress stage components and egress stage components of the interconnection network have corresponding global inputs and outputs, respectively. Middle stage components of the interconnection network receive internal inputs and provide internal outputs. The inputs can be connected to components within the same row or to components in another row.

Turning now to the figures, FIG. 1 depicts a logical diagram for an interconnection network. The particular interconnection network depicted is consistent with an 8-input, 8-output, 3-stage folded Benes network that is implemented using a plurality of 2×2 crossbar switch elements/components. Each stage in the network is shown in a column. As explained in more detail hereafter, however, embodiments are implemented using relatively wide multiplexers.

The diagram of FIG. 1 is a folded network in so much as each signal path (arrowed connectors) represents a bidirectional logic path for signals to traverse. The bidirectional path can be implemented as a single wire (or set of wires) with drivers at either end or as two separate wires (or set of wires), one (set) for each direction. Thus, the logic diagram of FIG. 1 could be depicted as a non-folded network with unidirectional arrows by essentially duplicating the various switch components (1-2, 4-5, 7-8 and 10-11), producing a five-stage network. Instead, the diagram of FIG. 1 depicts the network as being folded along the middle stage of switch components (3, 6, 9 and 12). The duplicated switch components of the folded network provide the functionality of two switch components, one in each signal direction. Network designs that implement individual switches for each switch can still co-locate the folded switches due to the similarities caused by the symmetry of the network design. Global input signals received in input ports 1-8 are received and routed to global output ports 1-8 according to a desired routing solution. In particular implementations, the interconnection network is rearrangeably non-blocking by virtue of the functionality provided by switch components 1-12 and the connection pattern among them. The diagram of FIG. 1 shows 8 global input/output ports, but is easily scalable to a relatively large number of global ports.

The functionality of the logic diagram of FIG. 1 can be implemented using a number of small switches (e.g., 2×2 crossbar switches). While systems that use relays or optical switches might find such an implementation viable or even preferred, such implementations can be less than ideal for other applications, such as programmable logic ICs. One potential issue relates to the signal delays caused by traversal of a large number of switch components. For the 8 global ports shown, the number of stages a signal traverses is at least 5. For instance, a signal that is routed from global input port 1 to global output port 6 could traverse the switch components 1→5→12→11→7. As the number of global ports grows, the number of switch components that need to be traversed increases accordingly. Moreover, implementations that use 2×2 crossbar switches as the primary switching components require a significant number of crossbar switches. In some interconnection networks, global outputs may be registered. That is, the output of the switch component may be stored and transmitted to the next stage at a subsequent clock period. Although these registers are not shown in the figures, many of the various embodiments, structures and methods described herein apply to both registered and non-registered networks.

Aspects of various embodiments are directed to selective optimization of the interconnection network for use in a programmable integrated circuit. In particular implementations, various switch components can be removed from the interconnection network and the functionality of the removed switch components can be implemented by careful placement of logic functions.

Figure 2:
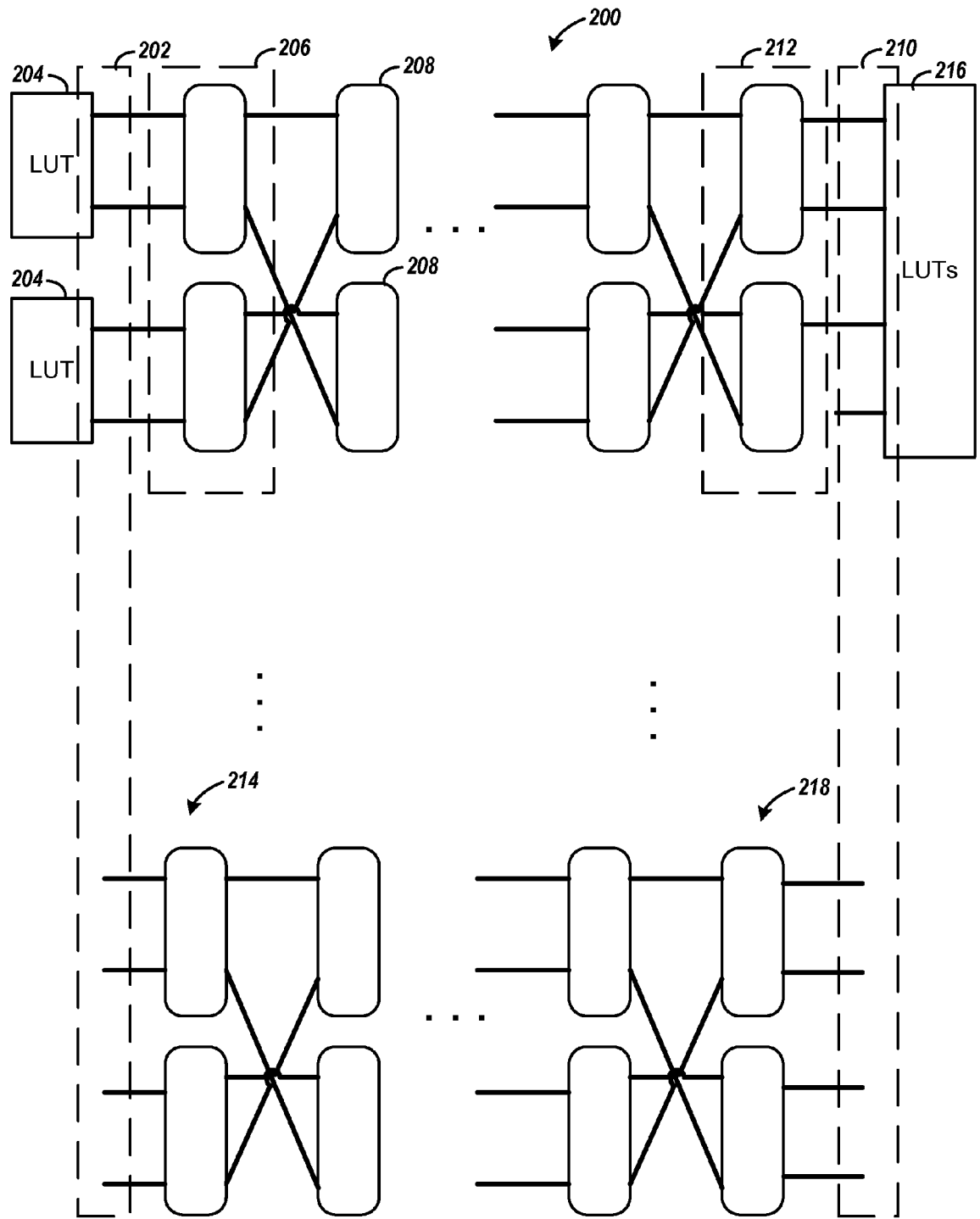
FIG. 2 depicts an interconnection network and corresponding connection to logic blocks with equivalent pins.

FIG. 2 depicts an interconnection network and corresponding connection to logic blocks with equivalent pins. Interconnection network 200 is a non-blocking network for routing signals between inputs 202 and outputs 210 (pins). The pins are connected to a number of different logic blocks. Each logic block can have pins that provide different functions. Aspects of the disclosed embodiments relate to identifying pins within a logic block that have equivalent functions. In particular implementations, the equivalence is due to properties of the programmable integrated circuit. These properties allow for the logic connected to equivalent pins to be configured for connection to either of the pins or represent pins that are connected to the same signal source. Accordingly, placement of the logic relative to the assignment of the logic to pins can provide the function of a set of switches. From this realization the network can be optimized, without adverse affect on the routing capabilities of the network, through a combination of the removal of switches with intelligent placement and assignment of logic relative to the equivalent pins.

In a specific implementation, the network is a Benes network and the equivalent pins are associated with look-up tables (LUTs). Interconnection network 200 depicts a Benes network of arbitrary size. LUTs 204 provide logic functionality by determining an output value in response to one or more inputs. The input values are used to determine the output value by retrieving the mapped output value from a memory within the logic block. Thus, if two LUTs receive the same set of inputs, each LUT can be configured to perform the logic function of the other. For some programmable logic ICs several LUTs are located within the same logic block and each of the LUTs receives the same set of inputs. Thus, the logic functions of a particular logic block can be assigned to any of the LUTs. In this manner, the LUTs are equivalent.

If a logic block contains four LUT outputs, such as those provided by LUTs 204, the diagram of FIG. 2 shows that for any particular routing solution the first set of switch components 206 in a Benes network does no more than rearrange the order of these inputs so as to present the rearranged order at the outputs. That is to say that given a particular order of the first four inputs of the network, the output of switch components 206 is these same four inputs, albeit possibly rearranged in order for the particular routing solution for these switch components. The equivalence of the rearrangement provided by the switches of the network, however, can be achieved by placement of the LUT logic into corresponding LUTs. Accordingly, switches 206 can be removed from the network so long as the placement logic is able to coordinate placement of the logic functions with the switch routing solution.

For many programmable integrated circuits, the outputs of the interconnection network are connected to inputs of logic blocks that are provided as inputs to LUTs. The same set of input signals is sometimes routed to each of the LUTs of a particular logic block. Thus, for a set of inputs to a logic block, the order of the inputs is not critical, so long as the logic blocks can be configured to account for the particular order. In this manner, the inputs to LUTs can be considered equivalent and the switches 212 can be removed from the interconnection network.

In the particular example shown in FIG. 2, each LUT in a logic block (LUTs 216) receives the same set of (four) inputs. Accordingly, the last set of switch components 212 rearranges the order of these inputs; however, each of the inputs is still provided to the LUT. By changing the LUT functional mapping between its inputs and its outputs, the programmable integrated circuit can be configured to account for different orders and routing solutions without using switch components 212. For instance, an LUT could be programmed to provide an output O that based upon the function O=(A & B)||(C &D). However, if the routing arrangement has been modified to remove switch components 212, certain routing solutions might result in the signal originally assigned to C being routed to input A and the signal originally assigned to A being routed to C. This can be compensated for by modifying the LUT mapping/function to be based upon the function O=(C &B)||(A &D). Based upon this understanding of equivalence, the corresponding outputs of the interconnection network can be considered equivalent pins and the set of switch components 212 can be removed from the interconnection network.

A similar analysis can be undertaken for pins other than those associated with LUTs. For instance, inputs to a multiplexer can be considered equivalent so long as the control signal for the multiplexer is configurable to account for different orderings of the inputs. Various other logic functions (e.g., NAND, XOR or memory addresses) can also be either order independent or configurable to account for different orders of the inputs. The corresponding set of switches can then be removed from the interconnection network.

Parts 214 and 218 of the interconnection network 200 can be connected to pins that are not equivalent (e.g., clocks, clock enables, IC-level input/output pins or initialization/reset). For such parts of the interconnection network the depth of switches can be maintained.

In particular implementations, the equivalence between pins may be sufficient to allow for multiple levels of switches to be removed. For instance, if eight pins are equivalent, a second level of switches (e.g., switches 208) from a Benes network might be able to be removed. This can be extended to any number of levels based upon the number of equivalent pins and the configuration of the interconnection network.

Figure 3:
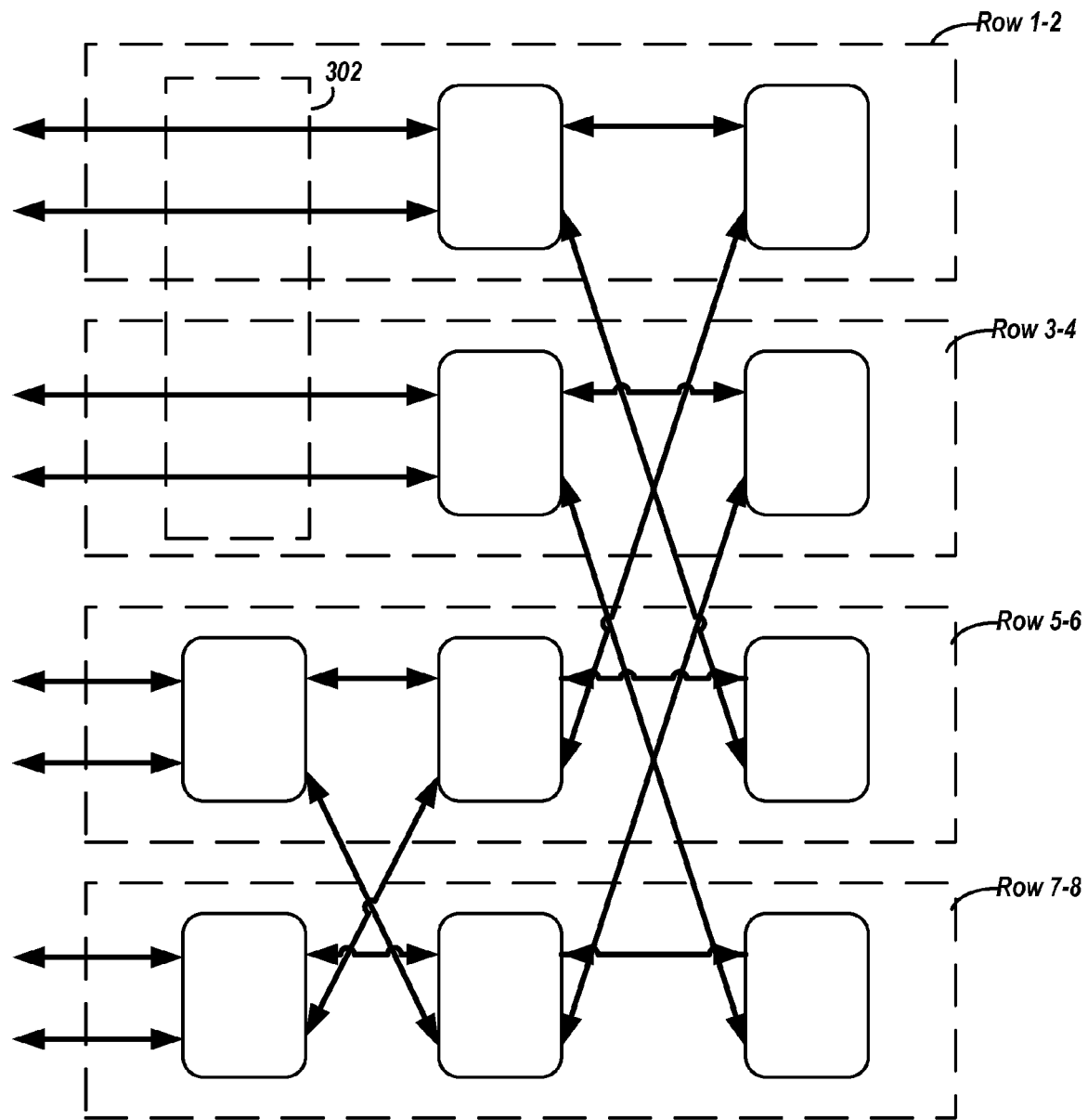
FIG. 3 depicts a logical diagram for an interconnection network with switch components removed to account for equivalent pins.

FIG. 3 depicts a logical diagram for an interconnection network with switch components removed to account for equivalent pins. FIG. 3 shows how the logical diagram of FIG. 1 can be optimized based upon the equivalent set of pins depicted in FIG. 2. Dashed block 302 indicates the location of switch components that are absent from FIG. 3, relative to FIG. 1.

FIGS. 1 and 3 are folded network diagrams and therefore the bidirectional arrows represent both incoming and outgoing signal paths for a symmetric network. As discussed in connection with FIG. 2, it is possible to have both input and output pins being equivalent for a particular set of pins. Thus, each removed switch component can represent two different switch components corresponding to the signal routing path in each direction. The selective removal of unnecessary switches need not be limited to symmetric removal of inputs and outputs, such as where the equivalence of inputs and outputs do not match. Instead, optimization can be implemented for an equivalent set of input pins and an equivalent set of output pins in a manner that is substantially independent for each set.

Advantages that can be realized in connection with the removal of switch components can depend partially upon how the network routing functionality is realized or implemented. In the case of 2×2 crossbar switches, for instance, gains can be in terms of one or more of routing delays, switching logic area and power. Other types of networks can realize these and/or other advantages. Accordingly, the same principle for optimizing the interconnection network of a programmable logic IC can be applied to interconnection networks other than a Benes network. For instance, fat-tree networks and multicast networks can also be optimized.

To implement the aforementioned optimizations, a placement module and routing module can each be configured to account for the optimized network. This is because the routing that would normally be provided by the removed switches is now performed using placement and/or configuration of the logic functions within the programmable logic IC. Accordingly, the placement module interfaces with the routing module to account for the optimized interconnection network by assigning the logic to provide outputs according to a particular routing solution. Moreover, the internal control logic (e.g., LUT lookup mapping or multiplexer control logic) can be configured to account for different orders for the inputs to the logic block.

The described embodiments are generally directed to implementations of interconnection networks that provide the functionality of a multistage interconnection network using nontraditional multiplexer components. As discussed in more detail herein, the nontraditional multiplexer components can be implemented using wide multiplexers. The nontraditional interconnection network, however, can include multiplexers of varying widths. The widths of these multiplexers can vary according to the number of stages in the multistage interconnection network for which the nontraditional network provides similar or equivalent functionality.

Aspects of one or more embodiments can be particularly useful for providing equivalent functionality to various network types while providing a low number of switching components that must be traversed and/or limiting the total number of switching components in the interconnection network. Particular implementations recognize that use of multiplexer-based logic allows for signal-routing paths to be significantly shortened relative to the number of switch components traversed and/or the wire length of the signals. For instance, a signal routed from a physical location back to an input near the same physical location can be implemented by providing a (relatively wide) multiplexer that effectively bypasses the logical levels between the input and output. Further details on such multiplexer-based configurations are provided herein.

Figure 4:
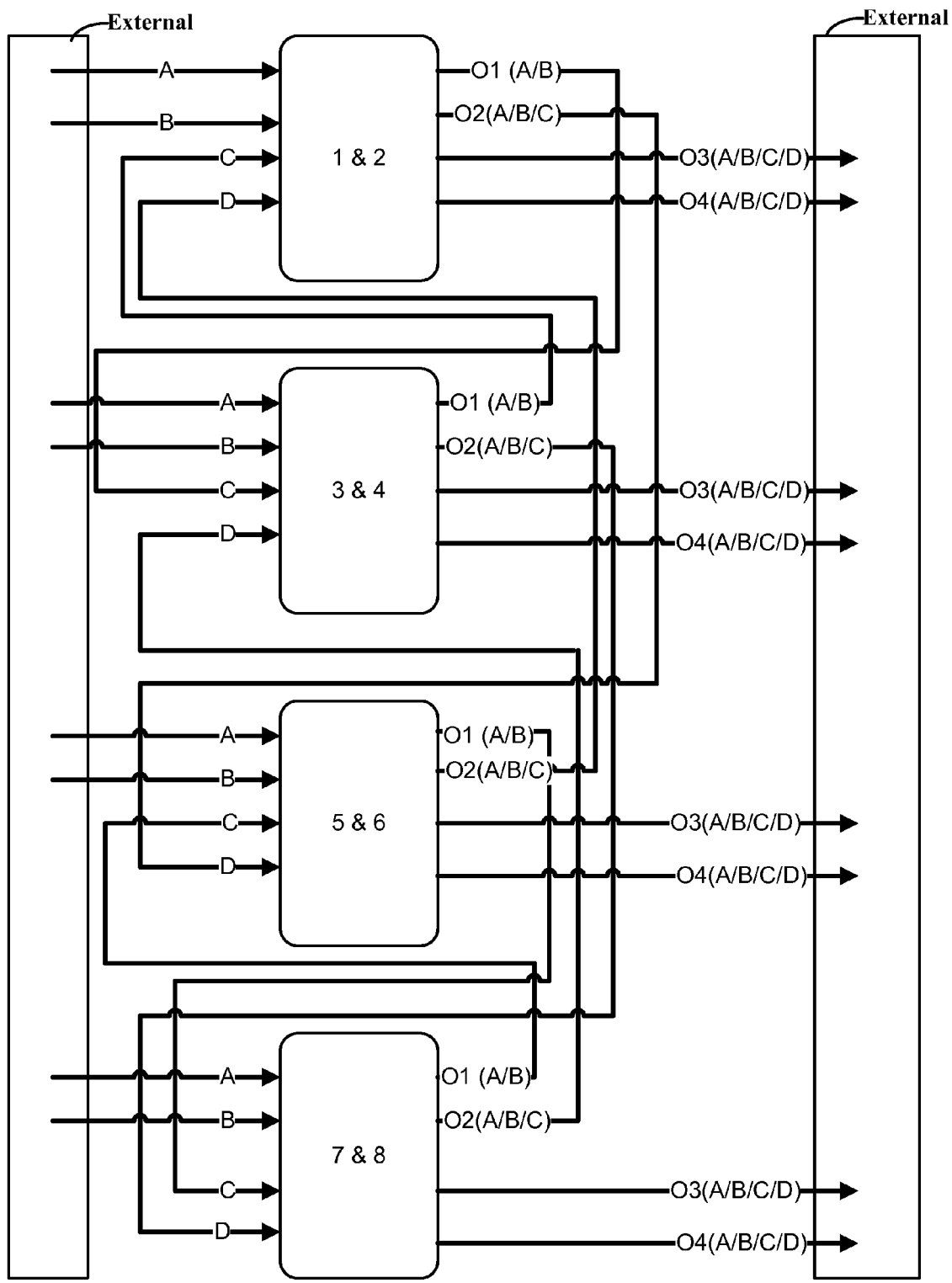
FIG. 4 depicts a logical diagram with global and internal signal routing for a multiplexer-based interconnection network.

FIG. 4 depicts a logical diagram with global and internal signal routing for a multiplexer-based interconnection network. The logical diagram of FIG. 4 represents the logical routing of signals in a 4×4 Benes network. Each block (1&2 and 3&4) represents an entire row. There are 4 different internal connections between the different rows. Thus, there are 2 internal inputs and 2 internal outputs for each row. FIG. 4 depicts these 4 internal inputs as C and D and the internal outputs as O1 and O2 for each respective row. Each row also contains two global inputs and two global outputs, which correspond to inputs A and B and outputs O3 and O4 of each row, respectively.

The potential mapping of the outputs of each row (O1-O4) relative to the inputs of each row (A-D) is depicted within the parenthetical for each output. Thus, output O1 can be either A or B; output O2 can be either A, B or C and outputs O3 and O4 can be either A, B, C or D. Outputs O1 and O2 are routed to inputs A or B in the other row as depicted. These potential mappings are derived from the corresponding possible routings of a Benes network. In this manner, the depicted network is rearrangeably non-blocking. It should be noted that network types other than a Benes network can be represented in a similar manner and/or minor modifications can be made thereto. For instance, various butterfly networks or mesh networks can be represented according to groupings of logical switch components and the corresponding possible signal routings on each internal and global connection of the network.

For a particular routing solution, each signal path is set to carry a particular signal of the potential signals listed. In an example use of the interconnection network, global input 3 may be mapped to global output 2. A signal from global input 3 will first be received at row 3&4 at input A. Row 3&4 has the capability of routing a signal on input A to any of outputs O1-O4. One path from global input 3 to global output 2 would include routing the signal from input A to output O2 of row 3&4. Output O2 of row 3&4 is received as input D of row 1&2. From here the signal can be routed directly to output O4 of row 1&2, which is directly connected to global output 2.

While FIG. 4 depicts the logical equivalence to a Benes network, a similar row-based logical diagram can be constructed for a number of other network types. Moreover, the logical diagram can be scaled for virtually any size network and can be implemented for variations of traditional network types. For instance, minor changes to the network types (e.g., the addition or removal of a few nodes or connections) can still be represented by a similar diagram.

Advantages of implementing the switching aspects of the interconnection network using wide multiplexers can be more easily seen when considering larger Benes networks. As the size of a Benes network increases, the stages in the network also increase in number. For some implementations, an increased number of stages can result in increased amount of logic, longer wire lengths and higher delay times.

The significance of the logical diagram of FIG. 4 may not be immediately apparent. Some embodiments, however, use particular configurations of multiplexers to provide the routing functionality of FIG. 4. In specific embodiments, any signal routing through a particular row traverses only a single switching component (e.g., a single multiplexer). This can be particularly useful for providing reduced latency caused by long wire lengths and/or the traversal of numerous switching components. These aspects are particularly well-suited for many modern programmable logic IC devices.

Figure 5:
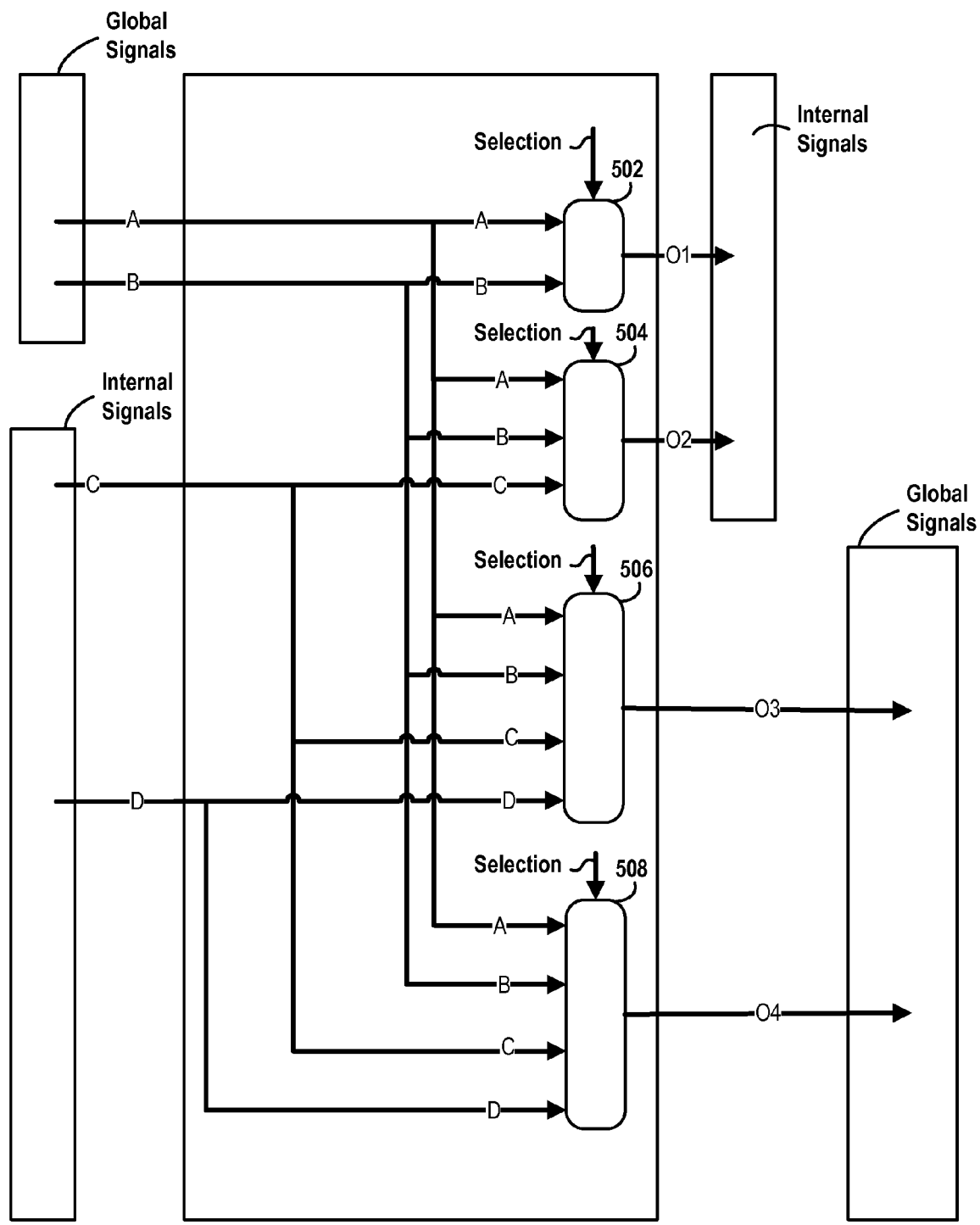
FIG. 5 depicts a set of multiplexers providing the functionality of one row from FIG. 4.

FIG. 5 depicts a set of multiplexers providing the functionality of one row from FIG. 4. Consistent with FIG. 4, each row receives two internal input signals (C & D) and two global input signals (A & B). Each row also provides two internal output signals (O1 & O2) and two global output signals (O3 & O4). Multiplexers 302-308 provide the routing functionality depicted in FIGS. 1 and 2. Selection signals control the outputs of each individual multiplexer.

The particular configuration of multiplexers and signal connections depicted in FIG. 5 represents a logical equivalent of a row taken from a Benes network. Each multiplexer is configured to correspond to an output from the Benes row by receiving, as inputs, each possible signal for the output. Thus, the individual switching components of the traditional Benes network are replaced by a flat set of multiplexers. The flat set of multiplexers is smaller in number than the number of switching components in a traditional Benes network, and since signals can traverse one of the flat multiplexers instead of several of the Benes switching components in series, signals reach their destinations with less delay.

The particular configuration is scalable according to the size of the Benes network. To conceptualize how larger networks would be implemented, the multiplexers can be broken into two different groups. The first group of multiplexers provides global outputs and the second group of multiplexers provides internal outputs. As used herein, an internal output is an output that is received by another row as an input, whereas a global output is an output that leaves the interconnection network.

It can be shown that, for a Benes network, any input (whether internal or global) of a particular row can be routed to either of the global outputs of the same row. Accordingly, the global (output) multiplexers of a Benes network-based solution are designed to be able to provide any input as an output. In FIG. 5 this means that each of output O3 and O4 can provide any of inputs A, B, C or D. As the size of the network increases, the number of stages increases. As the number of stages increases, the number of internal inputs for each row also increases. Accordingly, the output multiplexers increase in size to allow any of the inputs to be routed to the global outputs.

The internal (output) multiplexers provide outputs that correspond to various different stages of a Benes network. As such the number of internal multiplexers increases as the number of stages increases. Moreover, the number of possible signals provided at each internal output increases for each successive stage of a Benes network. For instance, internal multiplexer 302 is a 2 to 1 multiplexer that is capable of providing either signal A or B as an output. Internal multiplexer 304 represents an output for a successive stage in a Benes network and is therefore a 3 to 1 multiplexer that is capable of providing any one of signals A, B or C as an output. Thus, as the number of stages increases the size of each additional multiplexer also increases accordingly. This increasing size of multiplexers is not necessarily limited to Benes type networks, and regardless, the particular configuration can be modified to be consistent with network types other than a Benes network.

Figure 6:
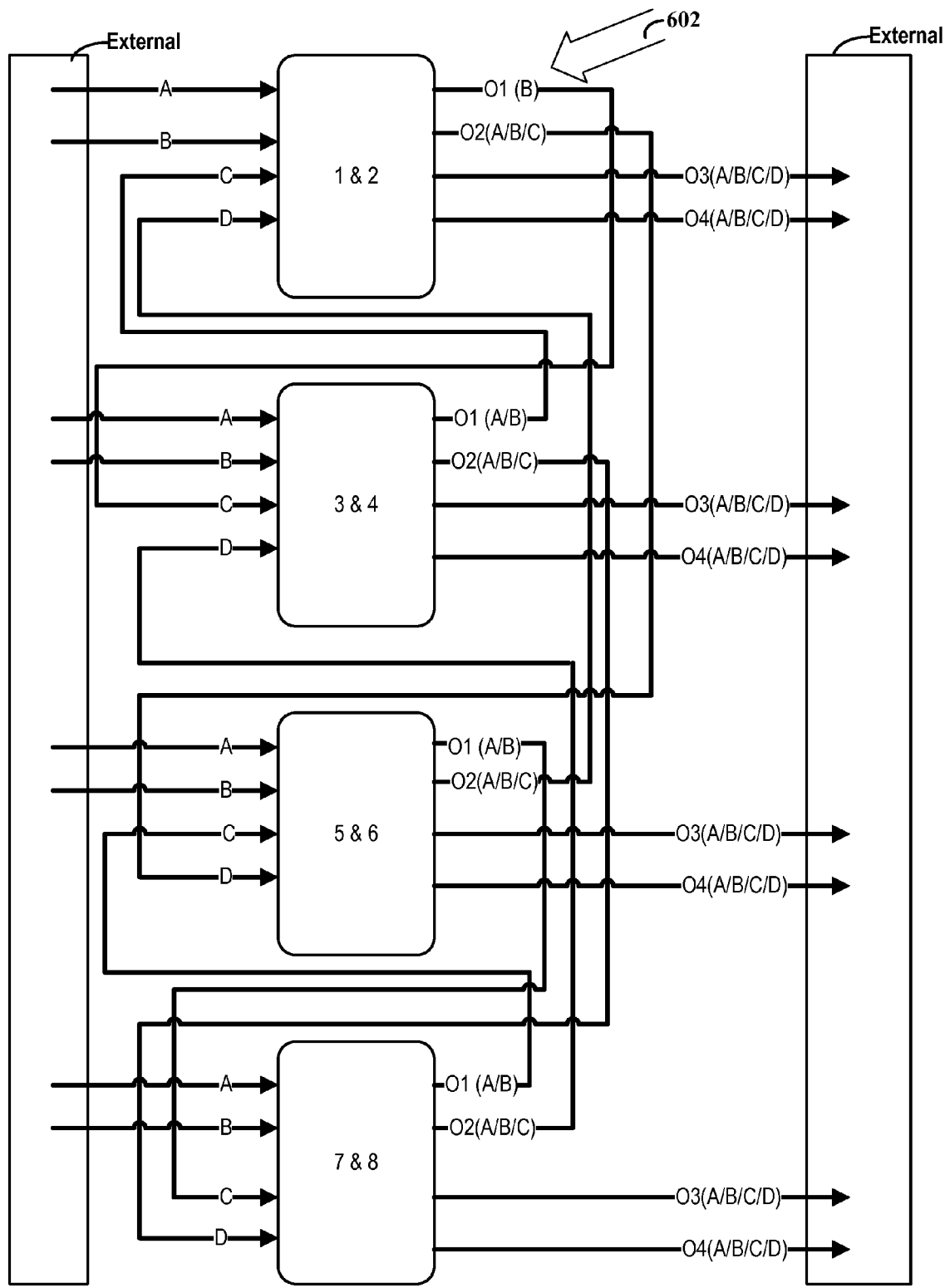
FIG. 6 depicts a logical diagram depicting global and internal signal routing for a multiplexer-based interconnection network modified to account for pin equivalence.

FIG. 6 depicts a logical diagram depicting global and internal signal routing for a multiplexer-based interconnection network modified to account for pin equivalence. In particular, FIG. 6 depicts modifications that can be made to the routing network, relative to FIG. 4, where global inputs A and B are determined to be equivalent. As indicated by arrow 602, output O1 of row 1 & 2 only provides B as an output. In this manner O1 can be directly connected to input B without the need for an intervening multiplexer. This can be particularly useful for reducing the area necessary to implement the interconnection network, improving delay times and/or reducing power.

Figure 7:
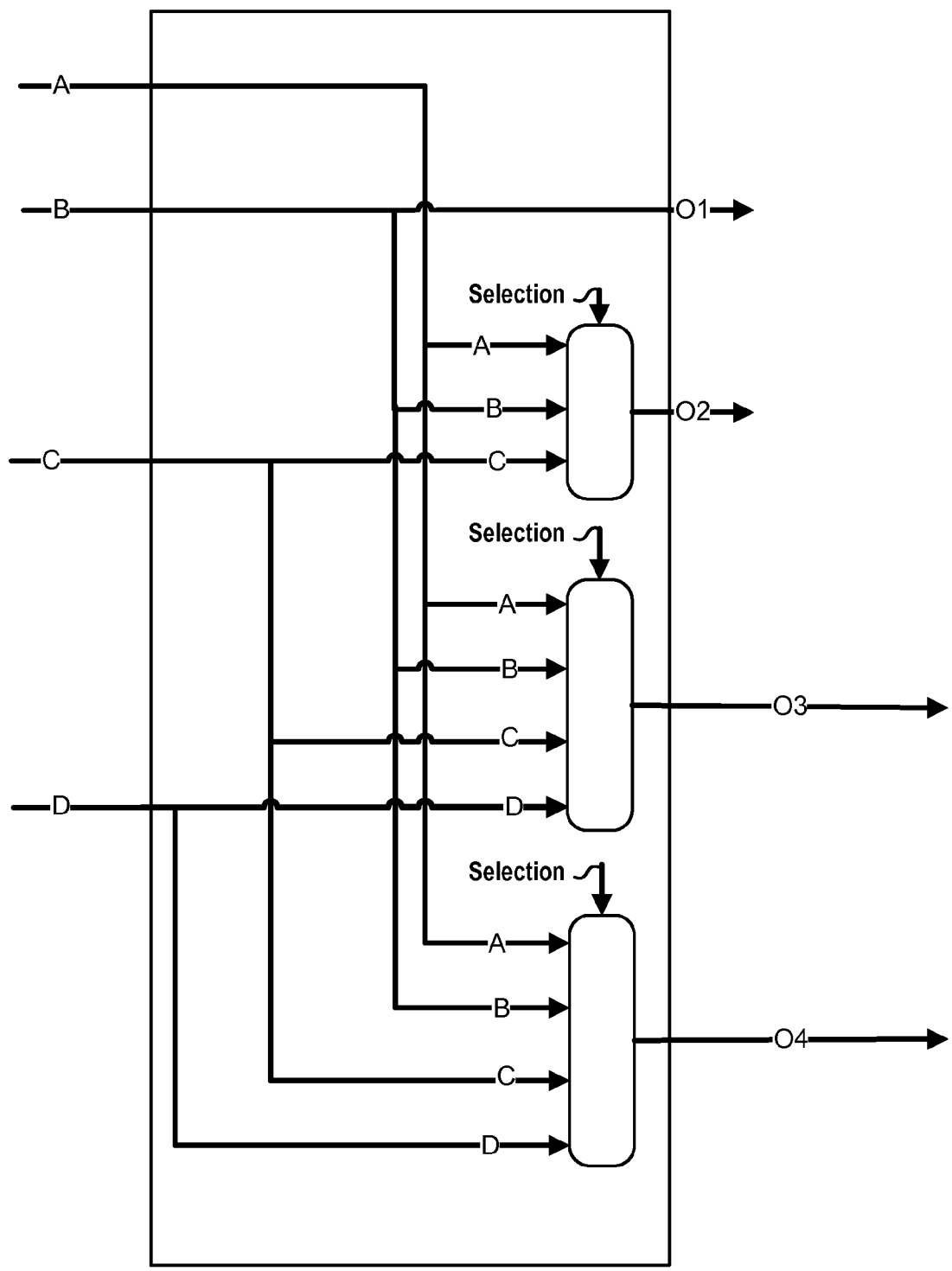
FIG. 7 depicts a set of multiplexers providing the functionality of the optimized row from FIG. 6.

FIG. 7 depicts a set of multiplexers providing the functionality of the optimized row from FIG. 6. As discussed in connection with FIG. 6, at least one multiplexer can be removed (e.g., relative to FIG. 5) due to the equivalency of the input pins. Accordingly, one less multiplexer is necessary to implement the network row. Moreover, the path from input to O1 does not require traversal of a multiplexer and therefore does not incur delays associated therewith. Other possible advantages relate to the reduction in control logic and control signal lines used to control the multiplexers.

Figure 8:
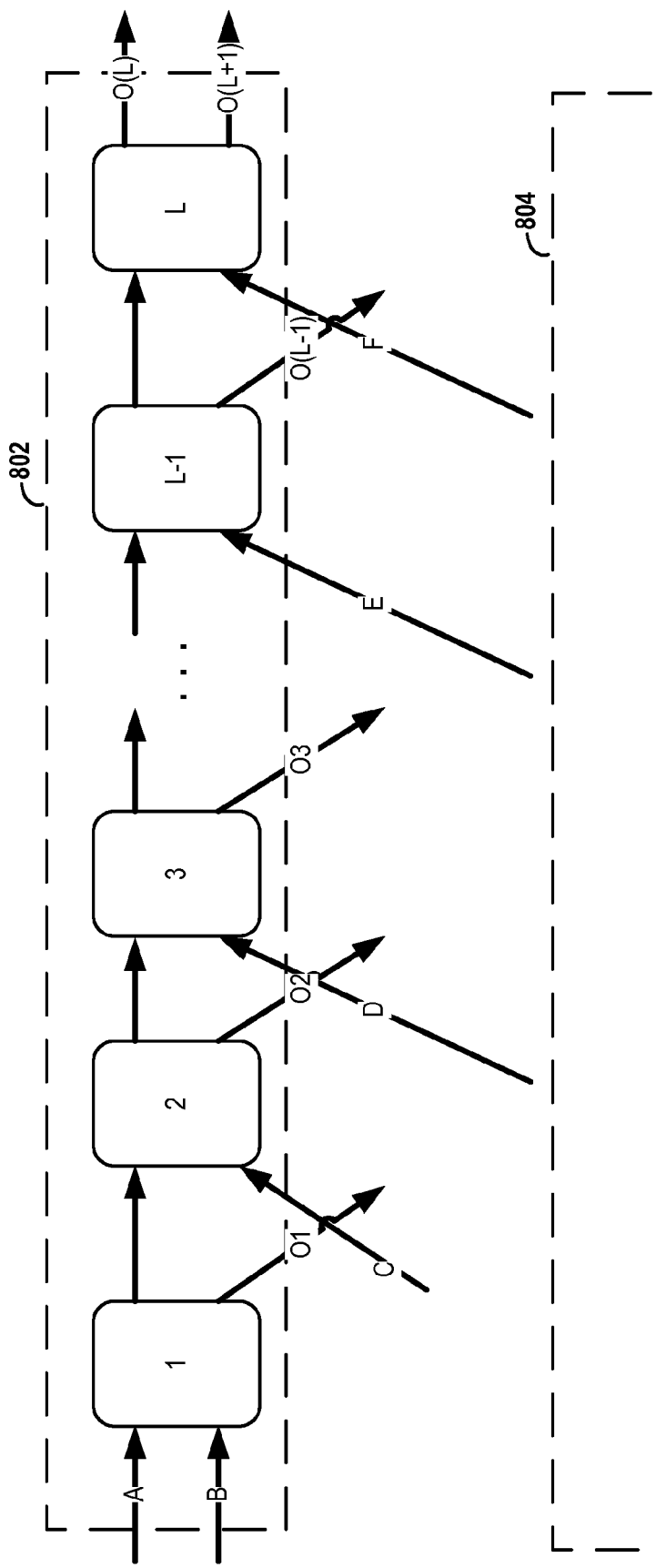
FIG. 8 depicts a logical diagram for a row of a non-folded Benes network.

FIG. 8 depicts a logical diagram for a row of a non-folded Benes network. In particular, FIG. 8 shows that the size of the Benes (or other) network is not limited to any particular size. The row 802 contains L stages, with the ellipses between rows 3 and L−2 representing an undetermined number of possible additional stages. Row 802 receives and sends data to other rows 804 in the network. Consistent with the preceding discussion, each output from the row 802 can be implemented using a multiplexer that receives, as inputs, all possible signals that can be routed thereto. For example, the internal multiplexer for O1 would receive inputs A and B; the internal multiplexer for O2 would receive as inputs A, B and C, and the internal multiplexer for O(L−1) would receive as inputs A, B, C, D and E. The internal multiplexer for O4 would also include any additional inputs for corresponding additional stages between stage 3 and stage L−2. Thus, for a five stage network there are two 6:1 global multiplexers and four internal multiplexers ranging in size from 2:1 up to 5:1. Moreover, one or more of these multiplexers can be removed in connection with equivalent pins, as discussed herein. The various networks can be implemented for a number of different networks including strictly or re-arrangeably non-blocking networks.

Particular implementations are directed toward implementations of networks within a programmable logic IC device. Modern programmable logic IC devices include a number of improvements/changes. Some of these improvements include lookup tables (LUTs) with six or more inputs, dedicated multiplexers, multiple-logic outputs, arithmetic support, hard logic for random access memory (RAM), dedicated flip flops, multiple LUTs per tile, swappable LUTs in a tile, I/O distributed in columns throughout the chip, unidirectional interconnection with switches implemented as multiplexers, Fc<<W (the percentage of inputs not connectable to each output is relatively high) and Fs<3 (each wire in the switch component connects to less than 3 wires). In recognition of these changes, and other changes, the disclosed embodiments are particularly well-suited for implementation in a programmable logic device IC. Accordingly, specific embodiments are implemented for programmable logic IC devices having tiles with 8 or more LUTs, 16 or more inputs, 4 or more outputs and unidirectional wiring.

Figure 9:
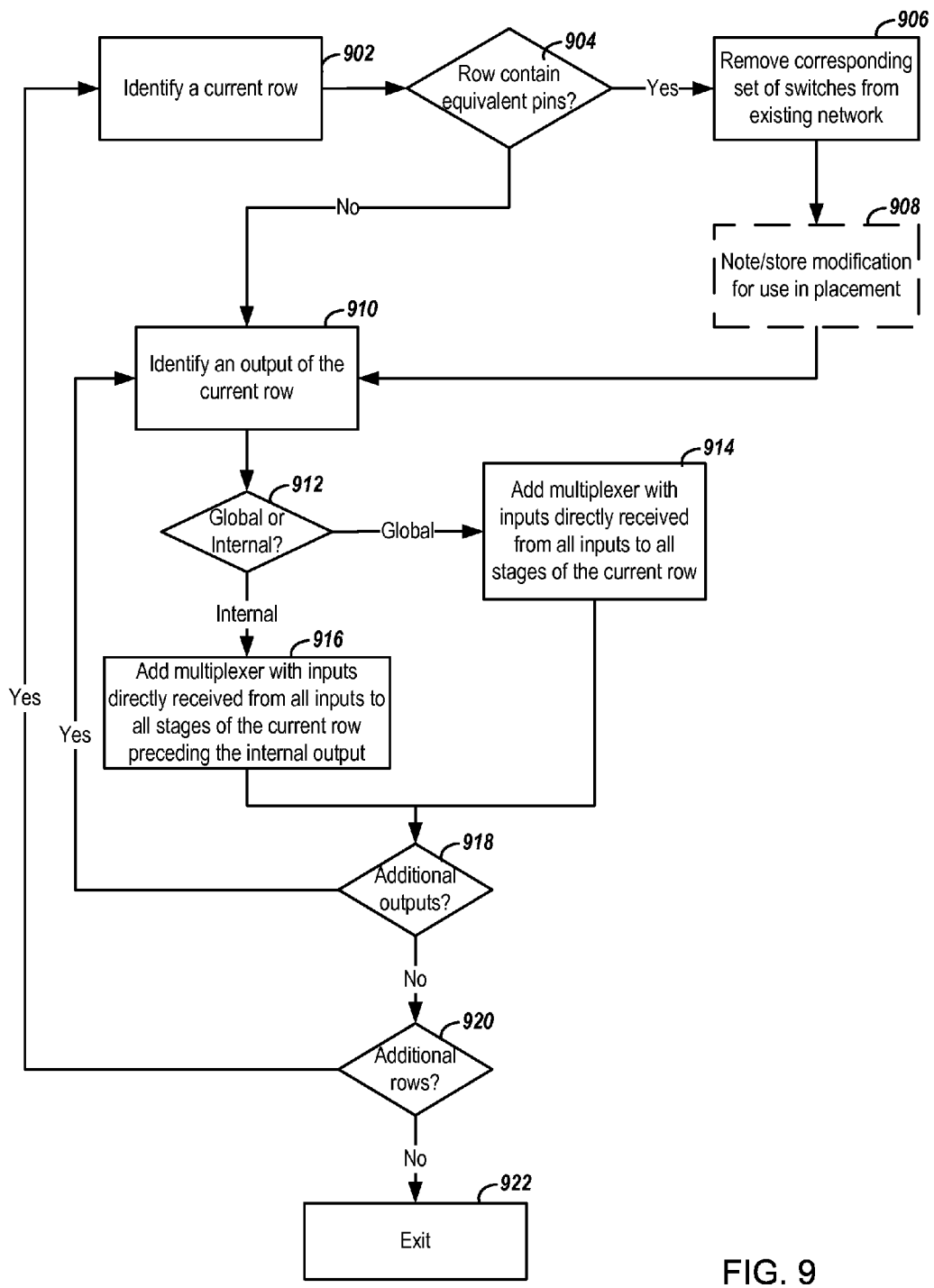
FIG. 9 depicts a flow diagram for designing a multiplexer-based interconnection network from an existing interconnection network type.

FIG. 9 depicts a flow diagram for designing a multiplexer-based interconnection network from an existing interconnection network type. The steps or operations depicted in FIG. 9 can be used to modify an existing interconnection network to produce a new interconnection network that uses relatively wide multiplexers to provide low-latency signal paths. The new interconnection network can also be optimized as a function of pin equivalence. The steps can be applied to a variety of different network types including, but not limited to, a Benes network.

Step 902 includes the identification of a current row of the existing interconnection network. A row represents a set of switches that a signal traverses in order to be routed between an input and an output. This means that the signal can be passed from the input to output without leaving the row. Of course, each row can have multiple routing paths that enter and leave the row and a particular signal can be routed out of the row depending upon the particular routing solution and a signal passing from input to output in the same row might still leave the row.

After a current row is selected, the input and output pins of the row are checked for equivalence at step 904. If there are no equivalent pins, the process proceeds to step 910. If, however, equivalent pins are identified, then the existing network is optimized by removing a set of switches corresponding thereto at step 906. Optionally, the optimization can be marked for use by a placement and/or routing module at step 908.

An output of that row is selected or identified at step 910. The selected output can be an internal output or a global output. In a particular implementation, the first output selected can represent an output for the first stage of the existing interconnection network. Subsequently selected outputs can be selected based upon outputs from sequentially selected stages.

Step 912 involves a determination as to whether the selected output is an internal output or a global output. If the output is an internal output, the process proceeds to step 916, and if the output is a global output, the process proceeds to step 914.

At step 916, a multiplexer is added to the new network. The multiplexer output provides an internal output that is routed to another row of the new network. The multiplexer is designed to accommodate all possible inputs to the row that can be routed to the selected output. In this manner, the configuration of the multiplexer can be implemented without knowledge of the other rows of the network. The resulting multiplexer is an N:1 multiplexer, where N=the total number of row inputs that can be routed to the selected output.

At step 914, a global multiplexer is added to the new network. The multiplexer output provides a global output that provides a signal to an external connection point of the new network. As in step 916, the multiplexer is designed to accommodate all possible inputs to the row that can be routed to the selected output. For a Benes type network, this includes all inputs to the row. Thus, the multiplexer is an M:1 multiplexer, where M=the total number of row inputs for the row.

At step 918 a determination is made as to whether or not there are any additional row outputs that have not yet been addressed by the method. If there are additional row outputs, the process selects a new row output and repeats. If there are not additional row outputs, the process proceeds to step 920.

At step 920 a determination is made as to whether or not there are any additional rows. If all rows have been addressed by the method, then the process exits at step 922. Otherwise, a new row is selected and the process repeats for the newly selected row.

Reasonable variations can be made to the process depicted in FIG. 9. For instance, various criteria can be used to determine that a wide multiplexer should not be provided for a particular output. In another instance, the width of a multiplexer can be limited to a maximum value. This maximum value can represent the limitations of the technology or be set based upon other criteria. The equivalent function can be implemented by smaller multiplexers arranged in combination.

The steps can be automated using a specially designed processor system. Instructions stored on a non-transitory/tangible storage medium can be accessed by a processor to implement the various steps. The processor can then store the output of the process, e.g., data representing the new interconnection network, on a non-transitory storage medium. This stored data can then be accessed and used to produce a circuit corresponding to the new interconnection network. The delay estimation described herein can be applied to a variety of methods for constructing an integrated circuit or programming for a programmable logic device.

Figure 10:
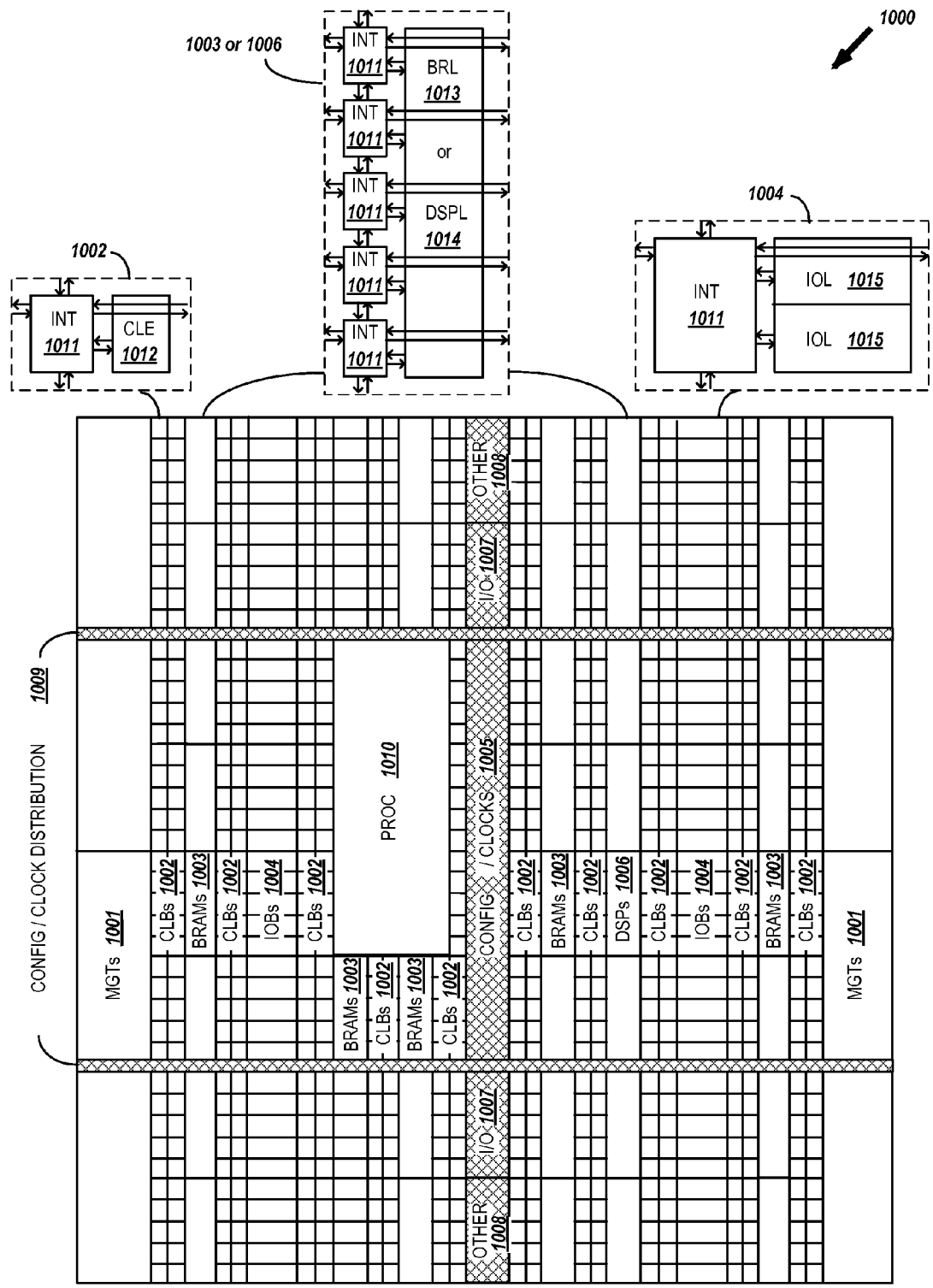
FIG. 10 is a block diagram view of a programmable logic integrated circuit.

FIG. 10 is a block diagram view of a programmable logic integrated circuit. The integrated circuit is an FPGA that includes a programmable interconnect element (INT 1011) switching fabric for routing signals between tiles. Therefore, the programmable interconnect elements taken together implement the programmable interconnect structure for the illustrated FPGA. The programmable interconnect element (INT 1011) also includes the connections to and from the programmable logic element within the same tile, as shown by the examples included at the top of FIG. 10. Collectively, the interconnect elements can be configured according to the various embodiments discussed herein.

The FPGA architecture includes a large number of different programmable tiles including multi-gigabit transceivers (MGTs 1001), configurable logic blocks (CLBs 1002), random access memory blocks (BRAMs 1003), input/output blocks (IOBs 1004), configuration and clocking logic (CONFIG/CLOCKS 1005), digital signal processing blocks (DSPs 1006), specialized input/output blocks (I/O 1007) (e.g., configuration ports and clock ports), and other programmable logic 1008 such as digital clock managers, analog-to-digital converters, system monitoring logic, and so forth. Some FPGAs also include dedicated processor blocks (PROC 1010). Configuration information and clocks can be distributed using configuration/clock distribution 1009.

For example, a CLB 1002 can include a configurable logic element (CLE 1012) that can be programmed to implement user logic plus a single programmable interconnect element (INT 1011). A BRAM 1003 can include a BRAM logic element (BRL 1013) in addition to one or more programmable interconnect elements. Often, the number of interconnect elements included in a tile depends on the height of the tile. In the pictured embodiment, a BRAM tile has the same height as five CLBs, but other numbers (e.g., four) can also be used. A DSP tile 1006 can include a DSP logic element (DSPL 1014) in addition to an appropriate number of programmable interconnect elements. An IOB 1004 can include, for example, two instances of an input/output logic element (IOL 1015) in addition to one instance of the programmable interconnect element (INT 1011). As will be clear to those of skill in the art, the actual I/O pads connected, for example, to the I/O logic element 1015 are manufactured using metal layered above the various illustrated logic blocks, and typically are not confined to the area of the input/output logic element 1015. In the pictured embodiment, a columnar area near the center of the die (shown shaded in FIG. 10) is used for configuration, clock, and other control logic.

Some FPGAs utilizing the architecture illustrated in FIG. 10 include additional logic blocks that disrupt the regular columnar structure making up a large part of the FPGA. The additional logic blocks can be programmable blocks and/or dedicated logic. For example, the processor block PROC 1010 shown in FIG. 10 spans several columns of CLBs and BRAMs.

Note that FIG. 10 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 10 are purely exemplary. For example, in an actual FPGA more than one adjacent column of CLBs is typically included wherever the CLBs appear, to facilitate the efficient implementation of user logic.

Figure 11:
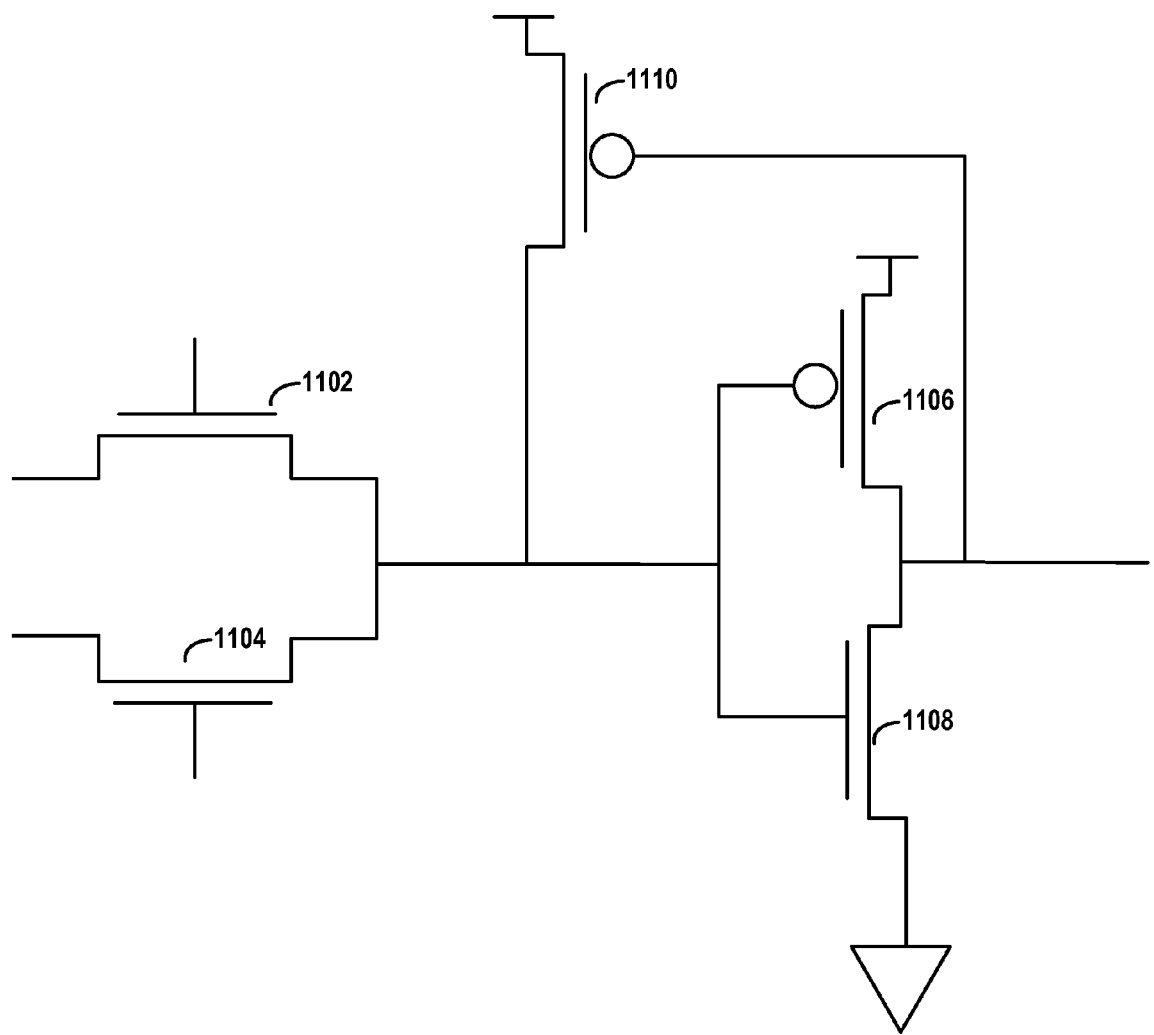
FIG. 11 depicts a circuit diagram for a multiplexer.

FIG. 11 depicts a circuit diagram for a multiplexer. The specific circuit diagram of FIG. 11 depicts a 2:1 multiplexer; however, larger multiplexers are possible and even preferred. The multiplexer of FIG. 11 can be used as part of the interconnection networks discussed herein. FETs 1102 and 1104 are input FETs that provide, as an output, either of two different inputs depending upon a control signal. FETs 1106 and 1108 operate as a buffer for the selected input. FET 1110 provides a pull-up function to the signal connecting the input FETs 1102/1104 and buffer FETs 1106 and 1108. The basic functionality for this 2:1 multiplexer can be used to construct larger multiplexers (e.g., 4:1, 8:1 or larger), as desired by, for instance, adding additional FETs connected as FET 1102 and FET 1104.

The specific circuit of FIG. 11 represents one possible implementation that can be used in connection with the interconnection networks discussed herein, and various other multiplexer circuits could be employed without limitation.

Particular embodiments allow for the multiplexer-based interconnection network to be further modified in a manner that takes advantage of the properties of programmable logic blocks of programmable integrated circuits or FPGAs. Many FPGAs are implemented using look-up-tables (LUTs) that are programmed to provide functionality of a particular design. The particular mapping of placement of logical functionality to these look-up-tables can be determined by a placement module. The placement module can consider a number of factors in determining where to place the logical functionality including whether or not the network has been optimized to account for intelligent placement of logic functionality.

The processes of the example embodiments may be implemented in a variety of computing arrangements. Those skilled in the art will appreciate that various alternative computing arrangements, including one or more processors and a memory arrangement configured with program code, would be suitable for hosting the processes and data structures and implementing the processes of the different embodiments. In addition, program code that implements the processes may be provided via a variety of computer-readable storage media or delivery channels such as magnetic or optical disks or tapes, electronic storage devices, or as application services over a network.

The architecture of the computing arrangement depends on implementation requirements as would be recognized by those skilled in the art. The computing arrangement may include one or more general purpose processors, or a combination of one or more general purpose processors and suitable co-processors, or one or more specialized processors (e.g., RISC, pipelined, etc.). The memory/storage arrangement of the computing arrangement may be hierarchical storage as is commonly found in computing arrangements. Such hierarchical storage typically includes multiple levels of cache memory, a main memory, and local and/or remote persistent storage such as provided by magnetic disks or electronic storage media. The memory/storage arrangement may include one or both of local and remote memory/storage, remote storage being coupled to the processor arrangement via a local area network, for example.

The present disclosure is thought to be applicable to a variety of interconnection networks. Other aspects and embodiments will be apparent to those skilled in the art from consideration of the specification and practice disclosed herein. It is intended that the specification and illustrated embodiments be considered as examples only, with a true scope and spirit of the of the invention being indicated by the following claims.

What is claimed is:

1. A method of generating a non-blocking routing network design from a crossbar switch-based network design, the non-blocking routing network design including connections to logic blocks of a programmable integrated circuit, the method comprising:
   using a programmed processor to perform steps including:
      determining, for each row of the crossbar switch-based network design, switches in the row that provide switching functions for logically equivalent external connections, the external connections being one of external inputs and external outputs;
      removing the identified switches from the crossbar switched-based network design;
      storing information about the identified switches and the logically equivalent external connections for access by a placement module associated with the programmable integrated circuit;
      accessing the stored information descriptive of the identified switches and the logically equivalent external connections; and
      placing a logic design within a programmable integrated circuit using the information descriptive of the identified switches and a routing solution.

2. The method of claim 1, wherein the steps further include:
   determining outputs for each of the rows, the outputs including internal outputs connecting to other rows and external outputs connecting to nodes external to the crossbar switched-based network;
   determining, for each determined output, a corresponding set of inputs that can be routed thereto; and
   providing, for each determined output, a corresponding multiplexer for connecting the respective set of inputs to the determined output.

3. The method of claim 1, wherein determining switches includes identifying switches that are coupled to a look-up-table (LUT).

4. The method of claim 1, wherein determining switches includes determining switches that are coupled to a look-up-table (LUT), and the method further comprising assigning outputs of the LUT as a function of a network routing solution.

5. The method of claim 1, wherein determining switches includes identifying switches that are coupled to the input of a common multiplexer.

6. The method of claim 1, wherein the crossbar switch-based network design includes one of a Clos network, a Benes network, a Banyan network, an Omega network and a Delta network.

7. The method of claim 1, wherein the steps further include adjusting a logic function relative to the logically equivalent external connections to compensate for the removed, identified switches.

8. The method of claim 1, wherein the programmable integrated circuit comprises a field programmable logic array.

9. A system for generating a non-blocking routing network design from a crossbar switch-based network design, the non-blocking routing network design including connections to logic blocks of a programmable integrated circuit, the system comprising:
   one or more processors;
   a memory arrangement coupled to the one or more processors, the memory arrangement configured with instructions that when executed by the one or more processors cause the one or more processors to perform operations including:
      determining, for each row of the crossbar switch-based network design, switches in the row that provide switching functions for logically equivalent external connections, the external connections being one of external inputs and external outputs;
      removing the identified switches from the crossbar switched-based network design;
      storing information about the identified switches and the logically equivalent external connections for access by a placement module associated with the programmable integrated circuit;
      accessing the stored information descriptive of the identified switches and the logically equivalent external connections; and
      placing a logic design within a programmable integrated circuit using the information descriptive of the identified switches and a routing solution.

10. The system of claim 9, wherein the operations further include:
    determining outputs for each of the rows, the outputs including internal outputs connecting to other rows and external outputs connecting to nodes external to the crossbar switched-based network;
    determining, for each determined output, a corresponding set of inputs that can be routed thereto; and
    providing, for each determined output, a corresponding multiplexer for connecting the respective set of inputs to the determined output.

11. The system of claim 9, wherein determining switches includes identifying switches that are coupled to a look-up-table (LUT).

12. The system of claim 9, wherein determining switches includes determining switches that are coupled to a look-up-table (LUT), and the method further comprising assigning outputs of the LUT as a function of a network routing solution.

13. The system of claim 9, wherein determining switches includes identifying switches that are coupled to the input of a common multiplexer.

14. The system of claim 9, wherein the crossbar switch-based network design includes one of a Clos network, a Benes network, a Banyan network, an Omega network and a Delta network.

15. The system of claim 9, wherein the operations further include adjusting a logic function relative to the logically equivalent external connections to compensate for the removed, identified switches.

16. The system of claim 9, wherein the programmable integrated circuit comprises a field programmable logic array.

17. An article of manufacture, comprising:
a computer readable non-transitory storage medium configured with instructions for generating a non-blocking routing network design from a crossbar switch-based network design, the non-blocking routing network design including connections to logic blocks of a programmable integrated circuit, the instructions when executed by the computer causing the computer to perform operations including:
- determining, for each row of the crossbar switch-based network design, switches in the row that provide switching functions for logically equivalent external connections, the external connections being one of external inputs and external outputs;
- removing the identified switches from the crossbar switched-based network design;
- storing information about the identified switches and the logically equivalent external connections for access by a placement module associated with the programmable integrated circuit;
- accessing the stored information descriptive of the identified switches and the logically equivalent external connections; and
- placing a logic design within a programmable integrated circuit using the information descriptive of the identified switches and a routing solution.

18. The article of manufacture of claim 17, wherein the operations further include:
- determining outputs for each of the rows, the outputs including internal outputs connecting to other rows and external outputs connecting to nodes external to the crossbar switched-based network;
- determining, for each determined output, a corresponding set of inputs that can be routed thereto; and
- providing, for each determined output, a corresponding multiplexer for connecting the respective set of inputs to the determined output.

19. The article of manufacture of claim 17, wherein determining switches includes identifying switches that are coupled to the input of a common multiplexer.

20. The article of manufacture of claim 17, wherein the crossbar switch-based network design includes one of a Clos network, a Benes network, a Banyan network, an Omega network and a Delta network.

* * * * *